United States Patent [19]
Han

[11] Patent Number: 5,394,363
[45] Date of Patent: Feb. 28, 1995

[54] PULSE WRITE DRIVER CIRCUIT

[75] Inventor: Gwang M. Han, Bubaleub, Rep. of Korea

[73] Assignee: Hyundai Electronics Industries Co., Ltd., Rep. of Korea

[21] Appl. No.: 174,799

[22] Filed: Dec. 29, 1993

[30] Foreign Application Priority Data

Dec. 31, 1992 [KR] Rep. of Korea ............... 1992-27338

[51] Int. Cl.$^6$ .................................................. G11C 7/00
[52] U.S. Cl. ........................ 365/189.01; 365/190; 365/194; 365/189.05; 365/189.08; 326/82; 326/104
[58] Field of Search ............... 365/189.01, 230.08, 365/194, 203, 189.11, 189.05, 189.06, 189.09, 190, 189.08; 307/445

[56] References Cited

U.S. PATENT DOCUMENTS 5,121,356  6/1992  Park et al. ..................... 365/203
5,278,788  1/1994  Nomura ...................... 365/189.01

Primary Examiner—Eugene R. LaRoche
Assistant Examiner—Huan Hoang
Attorney, Agent, or Firm—Merchant, Gould, Smith, Edell, Welter & Schmidt

[57] ABSTRACT

A pulse write driver circuit comprising a first NAND gate for inputting a write enable signal and a data input transfer negative signal, a second NAND gate for inputting the write enable signal and a data input transfer positive signal, an odd number of first inverters for sequentially inverting an output signal from the first NAND gate, a first NOR gate for inputting the output signal from the first NAND gate and an output signal from the first inverters, an odd number of second inverters for sequentially inverting an output signal from the second NAND gate, a second NOR gate for inputting the output signal from the second NAND gate and an output signal from the second inverters, an odd number of third inverters for sequentially inverting the write enable signal, a third NOR gate for inputting the write enable signal and an output signal from the third inverters, a fourth NOR gate for inputting output signals from the first to third NOR gates, and a fourth inverter for inverting an output signal from the fourth NOR gate. Also, the pulse write driver circuit comprises first and second NMOS transistors and first and second PMOS transistors.

1 Claim, 2 Drawing Sheets

PULSE WRITE DRIVER CIRCUIT

BACKGROUND OF THE INVENTION

1. Field of the Invention

The present invention relates to a pulse write driver circuit in which current consumption is minimized in a writing operation and data bus lines are precharged upon completion of the writing operation.

2. Description of the Prior Art

FIG. 1 is a circuit diagram of a conventional pulse write driver circuit and FIG. 2 is a timing diagram of signals in the pulse write driver circuit in FIG. 1. Data input transfer positive and negative signals D and /D are applied to NAND gates G1 and G2. In intervals T0–T1 and T5–T6 other than write intervals T1–T5, output signals DI and /DI from the NAND gates G1 and G2 are precharged with logical "1" regardless of the data input transfer positive and negative signals D and/D because a write enable signal WE is logically "0". At the moment T1 that a writing operation is started, the write enable signal WE becomes logical "1" and the output signals DI and /DI from the NAND gates G1 and G2 have their inverted states according to states of the data input transfer positive and negative signals D and /D through the NAND gates G1 and G2. Namely, because both the output signals DI and /DI from the NAND gates G1 and G2 were precharged with logical "1" before the time T1, one (for example, DI) thereof remains at logical "1", whereas the other (for example, /DI) goes from logical "1" to logical "0".

Subsequently, inverters 121–123 and a NOR gate G4 constituting a pulse generator are operated. In the interval (pulse width) T1–T2, a node N2 becomes logical "1" and a node N3 then becomes logical "1" through a NOR gate G5 and an inverter I3. As a result, NMOS transistors MN1 and MN2 are turned, thereby causing the output signals DI and /DI from the NAND gates G1 and G2 to be transferred to positive and negative data bus lines DB and /DB, respectively.

In the case where the states of the data input transfer positive and negative signals D and /D are changed in the write intervals (for example, T3), one (for example, DI) of the output signals DI and /DI from the NAND gates G1 and G2 goes from logical "1" to logical "0" and the other (for example, /DI) goes from logical "0" to logical "1". Subsequently, inverters I11–I13 and a NOR gate G3 constituting a pulse generator are operated. In the interval T3–T4, a node N1 becomes logical "1" and the node N3 then becomes logical "1" through the NOR gate G5 and the inverter I3. As a result, the NMOS transistors MN1 and MN2 are turned, thereby causing the output signals DI and /DI from the NAND gates G1 and G2 to be transferred to the positive and negative data bus lines DB and /DB, respectively.

As mentioned above, in the conventional pulse write driver circuit, the writing operation is performed only in the intervals T1–T2 and T3–T4 necessary to the writing operation and it is not performed in the remaining intervals T2–T3 and T4–T5. Therefore, current consumption can be minimized and a direct current (DC) current path can be blocked in the writing operation.

However, the conventional pulse write driver circuit has a disadvantage in that it is turned off upon completion of the writing operation, resulting in an increase in the time required in charging the data bus lines of a ground voltage with a power source voltage to perform the subsequent writing operation.

SUMMARY OF THE INVENTION

Therefore, the present invention has been made in view of the above problem, and it is an object of the present invention to provide a pulse write driver circuit in which current consumption is minimized and a DC current path is blocked in a writing operation, and data bus lines are precharged upon completion of the writing operation, so that the subsequent writing operation can be performed at a high speed.

In accordance with the present invention, the above and other objects can be accomplished by a provision of a pulse write driver circuit comprising first NANDing means having a first input terminal for inputting a write enable signal and a second input terminal for inputting a data input transfer negative signal; second NANDing means having a first input terminal for inputting the write enable signal and a second input terminal for inputting a data input transfer positive signal; an odd number of first inversion means for sequentially inverting an output signal from said first NANDing means; first NORing means having a first input terminal for inputting the output signal from said first NANDing means and a second input terminal for inputting an output signal from said first inversion means; an odd number of second inversion means for sequentially inverting an output signal from said second NANDing means; second NORing means having a first input terminal for inputting the output signal from said second NANDing means and a second input terminal for inputting an output signal from said second inversion means; an odd number of third inversion means for sequentially inverting the write enable signal; third NORing means having a first input terminal for inputting the write enable signal and a second input terminal for inputting an output signal from said third inversion means; fourth NORing means having a first input terminal for inputting an output signal from said first NORing means, a second input terminal for inputting an output signal from said second NORing means and a third input terminal for inputting an output signal from said third NORing means; fourth inversion means for inverting an output signal from said fourth NORing means; a first NMOS transistor having a gate connected to an output terminal of said fourth inversion means, a drain connected to an output terminal of said first NANDing means and a source connected to a positive data bus line; a second NMOS transistor having a gate connected to the output terminal of said fourth inversion means, a drain connected to an output terminal of said second NANDing means and a source connected to a negative data bus line; a first PMOS transistor connected to said positive data bus line; and a second PMOS transistor connected to said negative data bus line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
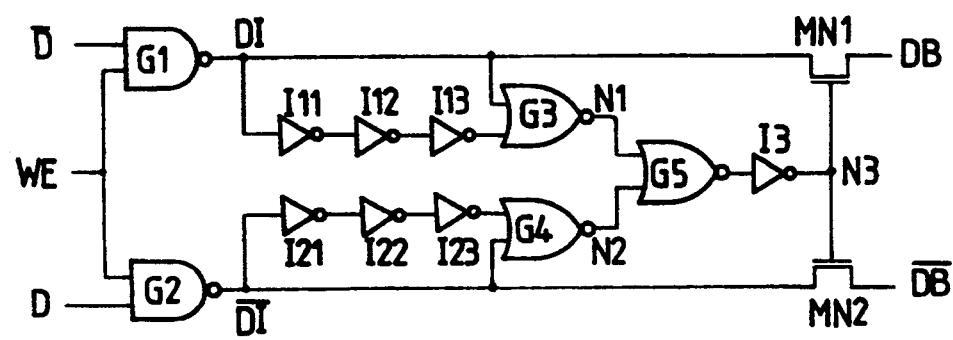
FIG. 1 is a circuit diagram of a conventional pulse write driver circuit.
Figure 2:
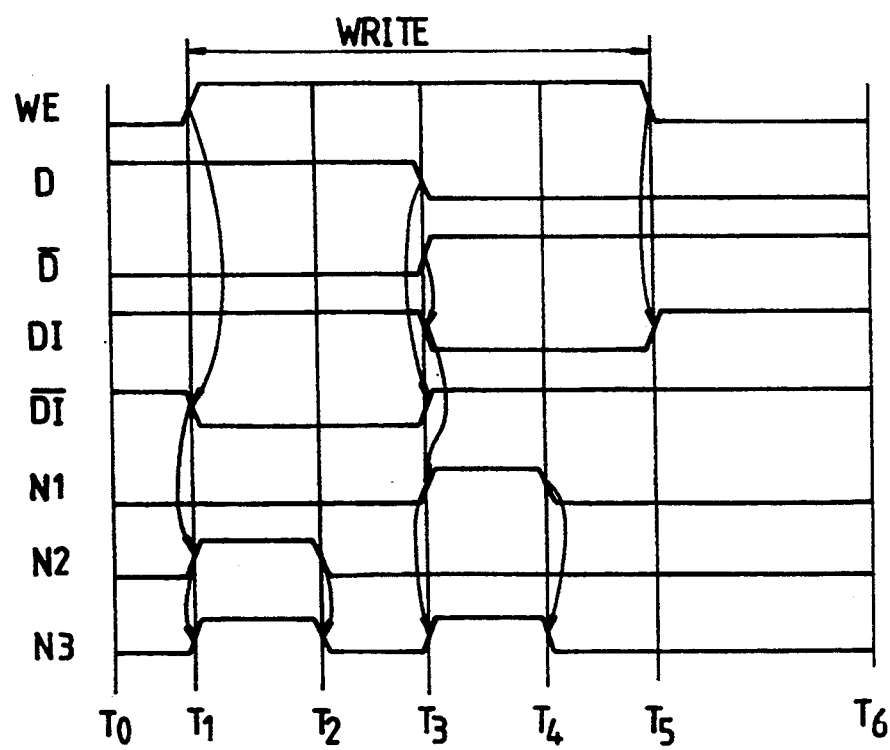
FIG. 2 is a timing diagram of signals in the conventional pulse write driver circuit in FIG. 1.
Figure 3:
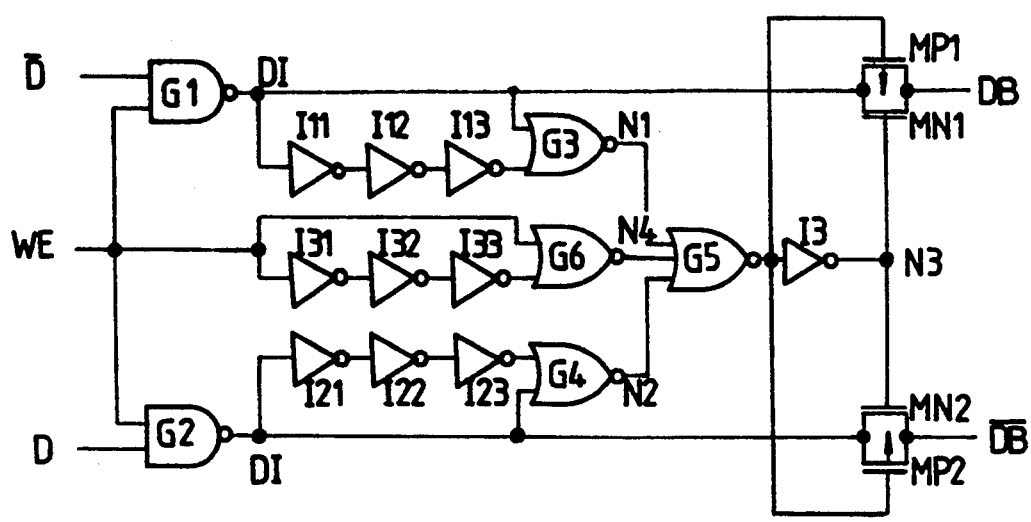
FIG. 3 is a circuit diagram of a pulse write driver circuit in accordance with the present invention.

Referring to FIG. 3, there is shown a circuit diagram of a pulse write driver circuit in accordance with the present invention. Some of parts in this drawing are the same as those in FIG. 1. Therefore, like reference numerals designate like parts.

As shown in FIG. 3, the NAND gate G1 is provided in the pulse write driver circuit to input the write enable signal WE and the data input transfer negative signal /D. The NAND gate G2 is adapted to input the write enable signal WE and the data input transfer positive signal D.

The inverters I11–I13 are also provided in the pulse write driver circuit to sequentially invert the output signal DI from the NAND gate G1. The NOR gate G3 is adapted to input the output signal DI from the NAND gate G1 and an output signal from the inverters I11–I13.

The inverters I21–I23 are also provided in the pulse write driver circuit to sequentially invert the output signal /DI from the NAND gate G2. The NOR gate G4 is adapted to input the output signal /DI from the NAND gate G2 and an output signal from the inverters I21–I23.

The pulse write driver circuit also comprises an odd number of inverters I31–I33 for sequentially inverting the write enable signal WE and a NOR gate G6 for inputting the write enable signal WE and an output signal from the inverters I31–I33.

The NOR gate G5 is also provided in the pulse write driver circuit to input output signals from the NOR gates G3, G4 and G6. The inverter I3 is adapted to invert an output signal from the NOR gate G5.

The NMOS transistor MN1 has a gate connected to an output terminal of the inverter I3, a drain connected to an output terminal of the NAND gate G1 and a source connected to the positive data bus line DB.

The NMOS transistor MN2 has a gate connected to the output terminal of the inverter I3, a drain connected to an output terminal of the NAND gate G2 and a source connected to the negative data bus line /DB.

Also, the pulse write driver circuit comprises a PMOS transistor MP1 connected to the positive data bus line DB and a PMOS transistor MP2 connected to the negative data bus line /DB.

Figure 4:
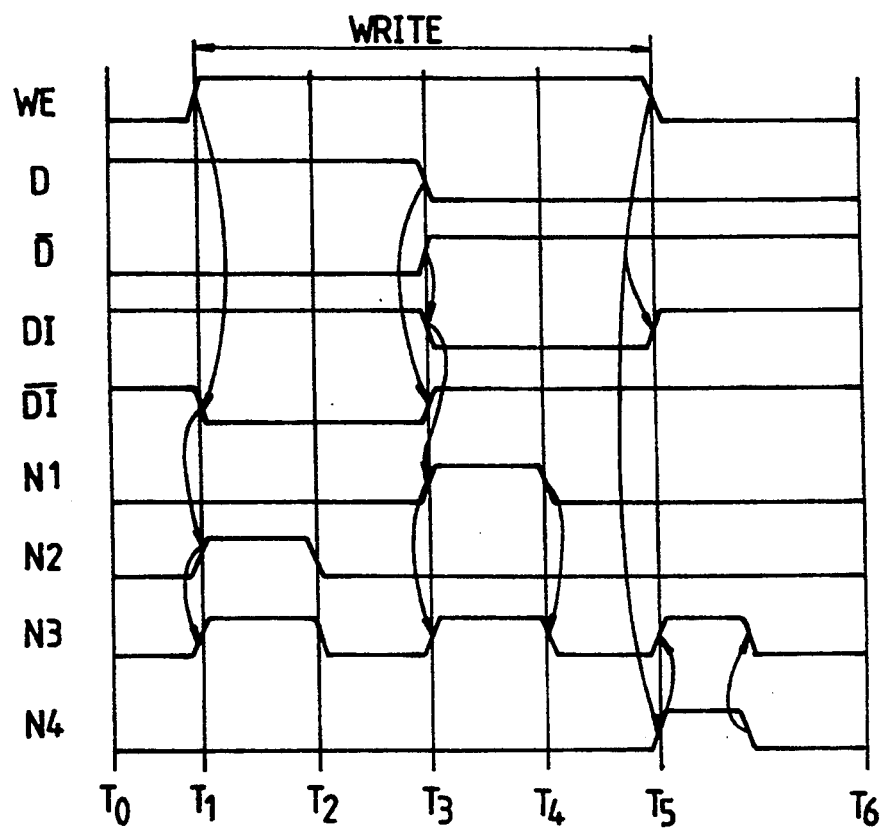
FIG. 4 is a timing diagram of signals in the pulse write driver circuit in FIG. 3.

The operation of the pulse write driver circuit with the above-mentioned construction in accordance with the present invention will hereinafter be described in detail with reference to FIG. 4 which is a timing diagram of the signals in the pulse write driver circuit in FIG. 3.

In the intervals T0–T1 and T5–T6 other than the write intervals T1–T5, the output signals DI and /DI from the NAND gates G1 and G2 are precharged with logical "1" regardless of the data input transfer positive and negative signals D and /D because the write enable signal WE is logically "0".

At the moment T1 that the writing operation is started, the write enable signal WE becomes logical "1" and the output signals DI and /DI from the NAND gates G1 and G2 have their inverted states according to the states of the data input transfer positive and negative signals D and /D through NAND gates G1 and G2. Namely, because both the output signals DI and /DI from the NAND gates G1 and G2 were precharged with logical "1" before the time T1, one (for example, DI) thereof remains at logical "1", whereas the other (for example, /DI) goes from logical "1" to logical "0".

Hence, the pulse generator of the inverters I21–I23 and the NOR gate G4 is operated. In the interval T1–T2, the node N2 becomes logical "1" and the node N3 then becomes logical "1" through the NOR gate G5 and the inverter I3. As a result, the NMOS transistors MN1 and MN2 are turned, thereby causing the output signals DI and /DI from the NAND gates G1 and G2 to be transferred to the positive and negative data bus lines DB and /DB, respectively.

When the states of the data input transfer positive and negative signals D and /D are changed in the write intervals (for example, T3), one (for example, DI) of the output signals DI and /DI from the NAND gates G1 and G2 goes from logical "1" to logical "0" and the other (for example, /DI) goes from logical "0" to logical "1". Subsequently, the pulse generator of the inverters I11–I13 and the NOR gate G3 are operated. In the interval T3–T4, the node N1 becomes logical "1" and the node N3 then becomes logical "1" through the NOR gate G5 and the inverter I3. As a result, the NMOS transistors MN1 and MN2 are turned, thereby causing the output signals DI and /DI from the NAND gates G1 and G2 to be transferred to the positive and negative data bus lines DB and /DB, respectively.

At the moment T5 that the writing operation is completed, a node N4 goes from logical "0" to logical "1" in response to the output signal from the NOR gate G6 which inputs the write enable signal WE and the output signal from the inverters I31–I33. As a result, the node N3 goes from logical "0" to logical "1" depending on the output signal from the NOR gate G5 which inputs the signals from the nodes N1, N2 and N4. Then, the positive and negative data bus lines DB and /DB are precharged by the PMOS transistors MP1 and MP2 for the full voltage Vcc transfer. Therefore, the subsequent writing operation can be performed at a high speed.

As apparent from the above description, according to the present invention, the writing operation is performed only in the intervals necessary to the writing operation and it is not performed in the remaining intervals. Therefore, current consumption can be minimized and a DC current path can be blocked in the writing operation. Also, the data bus lines are precharged upon completion of the writing operation, so that the subsequent writing operation can be performed at the high speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A pulse write driver circuit comprising:
   first NANDing means having a first input terminal for inputting a write enable signal and a second input terminal for inputting a data input transfer negative signal;
   second NANDing means having a first input terminal for inputting the write enable signal and a second input terminal for inputting a data input transfer positive signal;

an odd number of first inversion means for sequentially inverting an output signal from said first NANDing means;

first NORing means having a first input terminal for inputting the output signal from said first NANDing means and a second input terminal for inputting an output signal from said first inversion means;

an odd number of second inversion means for sequentially inverting an output signal from said second NANDing means;

second NORing means having a first input terminal for inputting the output signal from said second NANDing means and a second input terminal for inputting an output signal from said second inversion means;

an odd number of third inversion means for sequentially inverting the write enable signal;

third NORing means having a first input terminal for inputting the write enable signal and a second input terminal for inputting an output signal from said third inversion means;

fourth NORing means having a first input terminal for inputting an output signal from said first NORing means, a second input terminal for inputting an output signal from said second NORing means and a third input terminal for inputting an output signal from said third NORing means;

fourth inversion means for inverting an output signal from said fourth NORing means;

a first NMOS transistor having a gate connected to an output terminal of said fourth inversion means, a drain connected to an output terminal of said first NANDing means and a source connected to a positive data bus line;

a second NMOS transistor having a gate connected to the output terminal of said fourth inversion means, a drain connected to an output terminal of said second NANDing means and a source connected to a negative data bus line;

a first PMOS transistor having a gate connected to an output terminal of the fourth NORing means, a drain connected to the output terminal of said first NANDing means, and a source connected to said positive data bus line; and a second PMOS transistor having a gate connected to the output terminal of the fourth NORing means, a drain connected to the output terminal of said second NANDing means, and a source connected to said negative data bus line.

* * * * *